United States Patent
Dennison et al.

(10) Patent No.: US 7,823,091 B2
(45) Date of Patent: Oct. 26, 2010

(54) COMPILABLE, RECONFIGURABLE NETWORK PROCESSOR

(75) Inventors: Larry R. Dennison, Walpole, MA (US); Derek Chiou, Rollingwood, TX (US)

(73) Assignee: FutureWei Technologies, Inc., Plano, TX (US)

(*) Notice: Subject to any disclaimer, the term of this patent is extended or adjusted under 35 U.S.C. 154(b) by 76 days.

(21) Appl. No.: 11/413,133

(22) Filed: Apr. 27, 2006

(65) Prior Publication Data

US 2007/0011627 A1    Jan. 11, 2007

Related U.S. Application Data

(60) Provisional application No. 60/675,380, filed on Apr. 27, 2005.

(51) Int. Cl.
*G06F 17/50* (2006.01)
(52) U.S. Cl. .......................................... 716/1
(58) Field of Classification Search ............... 716/1, 716/3, 17
See application file for complete search history.

(56) References Cited

U.S. PATENT DOCUMENTS

| | | | | |
|---|---|---|---|---|
| 6,963,586 | B2 * | 11/2005 | Henriksson et al. | 370/469 |
| 2002/0133784 | A1 * | 9/2002 | Gupta et al. | 716/1 |
| 2003/0208723 | A1 * | 11/2003 | Killian et al. | 716/1 |
| 2005/0160402 | A1 * | 7/2005 | Wang et al. | 717/114 |
| 2005/0251647 | A1 * | 11/2005 | Taylor | 712/15 |

OTHER PUBLICATIONS

Gonzalez, R.E., Xtensa: a configurable and extensible processor, IEEE Micro, vol. 2(2), pp. 60-70, Mar.-Apr. 2000.*
Budiu, M. and Goldstein, S.C,. "Compiling Application-Specific Hardware," Carnegie Mellon University.
Markovskiy, Y., et al., "Analysis of Quasi-Static Scheduling Techniques in a Virtualized Reconfigurable Machine," *FPGA*, (2002).
Caspi, E., et al., "A Streaming Multi-Threaded Model," *Media and Stream Processors, in conjunction with MICRO-34* (2001).
Mangione-Smith, W.H., et al., "Seeking Solutions in Configurable Computing," *Computer*:38-43 (1997).
Clark, N., et al., "Automatically Generating Custom Instruction Set Extensions," University of Michigan.
Mirsky, E. and DeHon, A., "Matrix: A Reconfigurable Computing Device with Configurable Instruction Distribution (Extended Abstract)," MIT AI Lab.

(Continued)

*Primary Examiner*—Vuthe Siek
*Assistant Examiner*—Aric Lin
(74) *Attorney, Agent, or Firm*—Hamilton, Brook, Smith & Reynolds, P.C.

(57) ABSTRACT

A processor, particularly a network processor, is designed by first writing code to be processed by the processor. That code is then electronically compiled to design hardware of the processor and to provide executable code for execution on the designed hardware. To facilitate compilation, the written code may be restricted by predefined functional units to be implemented in hardware, and the executable code may include very long instruction word code. The functional units may be implemented in reconfigurable circuitry or custom circuitry, and the designed hardware may include combinational logic in reconfigurable circuitry.

22 Claims, 5 Drawing Sheets

OTHER PUBLICATIONS

Babb, J.W., "High Level Compilation for Gate Reconfigurable Architectures," Massachusetts Institute of Technology (2001).

Iseli, C. and Sanchez, E., "A C++ Compiler for FPGA Custom Execution Units Synthesis," *IEEE*, pp. 173-179 (1995).

Iseli, C. and Sanchez, E., "Spyder: A SURE (Superscalar and Reconfigurable) Processor," *The Journal of Supercomputing* 9:231-252 (1995).

Kastrup, B., et al., "ConCISe: A Compiler-Driver CPLD-Based Instruction Set Accelerator," *IEEE*, pp. 92-101 (1999).

Peymandoust, A., et al., "Automatic Instruction Set Extension and Utilization for Embedded Processors," Proceedings of the Application-Specific Systems, Architectures, and Processors (ASAP '03) *IEEE* (2003).

Cappelli, F.C., et al., "A Reconfigurable Processor Architecture and Software Development Environment for Embedded Systems," Proceedings of the International Parallel and Distributed Processing Symposium *IEEE* (2003).

Razdan, R and Smith, M.D., "A High-Performance Microarchitecture with Hardware-Programmable Functional Units," Proceedings of the Annual International Symposium on Microarchitecture, pp. 172-180 ACM (1994).

Veale, Brian F., et al, "Architectural Approaches for Dynamic Translation and Reconfiguration", *IEEE*, pp. 49-58 (2004).

* cited by examiner

FIG. 6

COMPILABLE, RECONFIGURABLE NETWORK PROCESSOR

RELATED APPLICATION

This application claims the benefit of U.S. Provisional Application 60/675,380, filed Apr. 27, 2005. The entire teachings of the above application are incorporated herein by reference.

BACKGROUND OF INVENTION

Network processors are special-purpose devices designed to process packets and/or streaming data. The basic functionality of network processors is to classify packets, that is, to determine the type of each packet and where that packet should go. Network processors may have other functionality such as collecting statistics and performing security operations. Some provide additional functionality not normally associated with network processing such as traffic management (queuing) and packet memory.

Ideally, network processors can be used in a variety of applications ranging from core Internet routers to metro/aggregation routers to enterprise routers found within large corporations to firewall routers. Since network processors process packets that are, in essence, streaming data, network processors are likely to be useful for other sorts of streaming computation such as MPEG encoding/decoding to perhaps even database transaction processing.

Network processors can be implemented in a variety of ways. The original network processors were general-purpose processors running a networking application. General-purpose processors, however, are far too slow for many networking applications today. Current network processor architectures range from hardwired special-purpose hardware (Sandburst), to configurable special-purpose hardware (AMCC) to programmable systolic arrays (Xelerated), to one or more RISC cores supported by highly specialized co-processors or co-processor interfaces (Intel, Agere, Motorola, Avici, EZChip, Cisco). One could argue whether or not a hardwired-solution that cannot be changed is a network processor at all, since it is not programmable. Regardless, more hardwired solutions are generally more power-efficient and silicon-efficient than more programmable solutions since they reduce or eliminate the interpretive cost of instruction execution and can place computation close to the data rather than always bringing the data to the computation. More programmable solutions, however, are more flexible and less prone to performance cliffs, where performance drops off rapidly beyond a certain load.

Programmable network processors have the distinct advantage of being able to support new protocols by simply reloading new microcode. (Network processor code is traditionally called microcode due to fact that most network processor code is low level code such as assembly code.). Network processors also tend to allow for one packet to consume cycles not used by another packet, replacing performance cliffs with a performance slope. It is sometimes the case, however, that the power cost of processing instructions over hardwired functionality is prohibitively expensive.

Network processor microcode depends on the network processor it runs on. Many network processors have a variant or restricted form of the C or C++ programming language to write microcode. Almost all network processors also allow users to write direct assembly code that is translated one-to-one to machine instructions that the network processor can interpret directly.

The number of instructions executed by a network processor to process a single packet varies widely between network processors and can also vary depending on the packets being processed. The Intel IXP2800, for example, has 16 micro-engines (each a small microprocessor with its own instruction store, registers and ability to access shared memory resources) running at up to 1.4 GHz. Since each micro-engine is theoretically capable of one instruction per cycle, the theoretical peak performance of such a processor is 22.4 G operations per second (theoretical peak is never reached in practice since memory latencies reduce instructions per cycle to well below 1.) Since the Intel IXP2800 is a 10 Gb/sec capable processor, it is supposed to be able to process and queue 25M packets per second (minimum-sized packets are 40 B.) Thus, each packet has a budget of almost 900 instructions.

The Avici Snare processor, on the other hand, runs at 100 MHz, as a single micro-engine and is capable of processing packets at 2.4 Gb/sec or about 6.25M packets per second. Thus, for Snare the instruction budget per packet is only about 14, substantially lower than Intel's processor. The IXP2800 is theoretically capable of packet queuing and buffering as well. But even after removing the instructions for queuing and buffering, the Intel network processor must execute substantially more instructions to process each packet.

The reason for the large difference in the number of instructions is the power of each instruction. In order for the Intel IXP2800 to implement a tree traversal, where a tree structure is stored in memory with each node of the tree either pointing to another node in the tree or to NULL, it must issue a load for the pointer in the first node in the tree, wait for that pointer to return, then use that pointer to issue the next read and so on. The Avici Snare, on the other hand, issues a single tree traversal command that returns only after a co-processor has traversed the tree. The Intel IXP2800 provides, for the most part, RISC-like instructions with RISC instruction power. The Avici Snare, on the other hand, has very powerful instructions customized for the tasks found in network processing applications.

Thus, the microcode to implement the same functionality varies substantially between network processors. Because of the very small number of instructions that the Avici Snare executes, writing microcode for it tends to be fairly straightforward. Writing efficient microcode for the Intel processor, on the other hand, is generally considered a very difficult task. Thus, a customized instruction set also helps the programmers writing code for the network processor.

In either case, however, there are limits to what the network processors are capable of doing. Snare is capable of processing packets using the instructions it has. If another instruction becomes necessary for a future packet processing requirement, that instruction cannot be added since Snare is an ASIC and its underlying structures cannot be changed.

Traditional microprocessors are designed to give the appearance of executing one instruction at a time which is sometimes called in-order instruction execution. For example, take the following code.

```
A: R0 = R1 + R2
B: R2 = R0 + R3
C: R6 = R4 + R5
D: R2 = R2 + R1
```

Instruction B should see the architectural machine state, including the registers, condition codes, and so on, consistent with instruction A already having been fully executed. Likewise, instruction C should see the machine state being consistent with instruction B fully executed (and, by commutativity, instruction A would have been executed before instruction B.) Likewise, instruction D should see machine state consistent with instruction A executing to completion, then instruction B, then instruction C.

Such a machine has several advantages. The instruction-completes-before-the-next-instruction-starts model is very easy to understand. It is easy for a compiler to generate such code. Techniques for improving the performance of a processors that support the single-instruction model are well known and have been implemented in many processors. For example, instruction C is independent of instructions A, B and D and thus can correctly execute before or after any of them. By executing independent instructions at the same time as other independent instructions, performance can be improved while still maintaining the illusion of a single instruction executing to completion before the next starts. (In general, executing independent instructions simultaneously can destroy the illusion of in-order instruction execution. Exceptions and reordered memory operations when there are multiple writers are two examples of when additional support must be provided to allow out-of-order execution to appear to be in-order.) Machines that dynamically determine which instructions are independent and can execute in parallel and actually execute instructions out of program order are called out-of-order processors. Such techniques do not require machine executable code to match the processor in order to run efficiently. For example, imagine a processor that can execute two independent instructions at a time compared with a processor that can execute four independent instructions at a time. Since the processor itself determines which instructions can be executed in parallel rather than encoding that information into the instructions, both processors can potentially extract available parallelism in any program.

Determining what instructions can be executed concurrently is not trivial and does require a significant amount of hardware resources. It is possible to define an instruction set architecture (ISA) that specifies multiple instructions that can be executed concurrently in a single block of instructions. Generally, the number of instructions in a block is fixed and often times there is a fixed mix of instructions within a block. For example, an instruction block might contain 2 integer instructions, 1 load/store instruction, 1 floating point instruction and 1 branch instruction. The reason for a fixed mix of instructions is obvious; there is a one-to-one correspondence between the functional units within the processor and the allowed instructions per block. Such ISAs are called Very-Long-Instruction-Word (VLIW) ISAs. VLIW processors can issue instructions to every functional unit simultaneously (but, obviously is not required to issue to every functional unit for every instruction), thus maximizing the parallelism that can be exploited and leveraging the available functional units.

Machines that implement VLIW ISAs tend to be far simpler than standard machines since they do not need to dynamically determine which instructions can execute concurrently. The compiler has done that statically by specifying bundling of single instructions into VLIW instructions. To further simplify the architecture and implementation, most VLIW machines execute each VLIW instruction to completion within a pipeline stage before advancing to the next pipeline stage. Doing so dramatically simplifies the hardware at the cost of performance. One slow instruction within a VLIW instruction will stall all of the other instructions in the same VLIW instruction and all other VLIW instructions behind it.

In order to further improve performance, some VLIW machines are also multithreaded as well. One such machine is the Tera/Cray MTA. Rather than let a slow VLIW instruction block the machine, the machine can switch to another thread where the previous instruction is completely finished and the next VLIW instruction is ready to execute. Such a machine enjoys the simplicity of in-order execution while paying relatively little to support multi-threading and thus avoid the penalties of in-order execution when multiple threads are available to execute.

Once defined, a VLIW ISA can limit machines that implement that ISA. For example, if a VLIW ISA specifies a certain mix of component instructions, going to a machine that has more functional units does not improve performance. One could specify a VLIW ISA that is much larger than any current machine, thus giving the machine room to grow, but then code will often wind up with many no-op instructions since there is not always instructions that can be executed concurrently and thus expand the program size. Also, executing such a super-VLIW ISA on a machine with fewer functional units would require hardware support to break down those super-VLIW instructions. Specifying a variable number of instructions within a VLIW instruction is another solution but also requires more complex hardware to deal with the variable number.

The simplest solution to the issue of a VLIW ISA limiting the implementation is to recompile the VLIW code for a specific target machine. Though undesirable from a code compatibility standpoint, recompiling ensures that the VLIW word is correctly sized for the machine that will run the code and thus keeps the hardware simple.

SUMMARY OF THE INVENTION

In one method of designing a processor, particularly a network processor, code that is to be processed by the processor is first written. That code is electronically compiled to design hardware of the processor and also electronically compiled to executable code for execution on the designed hardware. The resultant design maybe fabricated and the executable code installed to complete the operational processor.

In the same or an alternative design approach, the written code is electronically compiled to design a data path of the processor in hardware and electronically compiled to design control of the processor. The control may include executable code.

In certain embodiments, the code is restricted to predefined functional units to be implemented in hardware. That code may be written in a restricted form of a higher level language such as C. The executable code may include very long instruction word code that makes calls to functional units. The code may be restricted so that each functional unit is used no more than a fixed number of calls from each very long instruction word.

The designed hardware may include combinational logic to process inputs to and/or outputs from functional units. A functional unit may be implemented in reconfigurable circuitry such as in field programmable gate arrays (FPGA). A functional unit may also be implemented in custom circuitry such as an application specific integrated circuit (ASIC). The designed hardware may also include combinational logic and data paths in reconfigurable circuitry.

At least a portion of the executable code may be implemented as a finite state machine in hardware.

A processor design tool may comprise a code-to-hardware-design compiler component that designs hardware from the code and a code-to-executable-code compiler component that generates executable code from the written code for execution on the designed hardware.

One preferred embodiment automatically generates a network processor implemented in field programmable gate arrays (FPGAs) from microcode. The network processor is built around (i) a set of predefined high-performance coprocessor blocks that can be implemented in FPGAs as well and (ii) specialized hardware automatically generated for a specific microcode that performs specialized tasks, such as coordination and word-reformatting. The goal is to produce a high-performance, efficient network processor tuned for the particular microcode being executed. Flexibility is provided by the FPGA. When the microcode changes, the network processor implementing that microcode changes as well. The approach promises to be at least as flexible as fully programmable network processors while providing the performance and low-power characteristics of the hardwired solutions. Network processing applications are especially well suited for this approach since the microcode changes fairly infrequently, making the relatively long time to load an FPGA a non-issue while power and performance are issues.

DETAILED DESCRIPTION

An ideal network processor is high in performance, low in power, flexible, and easy to program. Achieving all of these goals simultaneously, however, is very difficult given the current approaches to network processor design. Disclosed is a method to generate a network processor that is high in performance, low in power, flexible and easy to program. It combines the high-performance and low-power of a hardwired design and the flexibility of a programmable design and ease of programming of a powerful instruction-set design.

This method leverages powerful field-programmable gate arrays (FPGAs) that are essentially hardware that can be reprogrammed to implement new functionality. FPGAs can be programmed and used as hardwired network processors. This approach is a traditional hardware approach to solving the problem and thus requires a traditional hardware development effort, involving architects to define and design at the high level, designer engineers to implement that design and verification engineers to verify the design. The hardware development cycle, however, is far longer than the approximately quarterly microcode changes to support new features, clean out bugs, etc.

In this description we use the term microcode to mean the code written to describe the functionality to be implemented by the generated processor. Unlike traditional microcode, it is not necessarily low level code but could be high-level code as well.

The ideal solution is to automatically create the network processor and the code that runs on it from the microcode, effectively making the software engineers writing the microcode de facto hardware engineers. If the transformation from microcode to network processor and code is always accurate, verifying the microcode will ensure that the network processor is correct.

As with microcode for various network processors, microcode for our network processor can potentially take many forms, ranging from anything legal in a general-purpose language like C or a restricted form of a language such as C with several pre-defined functions or a pre-defined assembly language similar to that of a standard network processor. The first possibility, compiling a general purpose language to hardware, is a difficult and general problem. Much exploratory work has been done in this area. The third possibility does not provide any significant advantage over using a standard network processor.

The second possibility is the approach presented in the preferred embodiment. By carefully restricting a general-purpose language to constructs that can be converted to FPGA hardware and by providing a selected set of higher-level functions that can both be implemented efficiently in FPGA hardware and support the necessary functionality to implement all required network processor functionality, a network processor supporting such microcode can be automatically generated. Thus microcode is developed in this restricted language augmented with certain functions. For example, the microcode may be written for a network processor that contains one content-addressable memory (CAM), a tree-traversal unit and two counter units. Each functional unit has specific properties and abilities that are known to the microcode writer.

Figure 1:
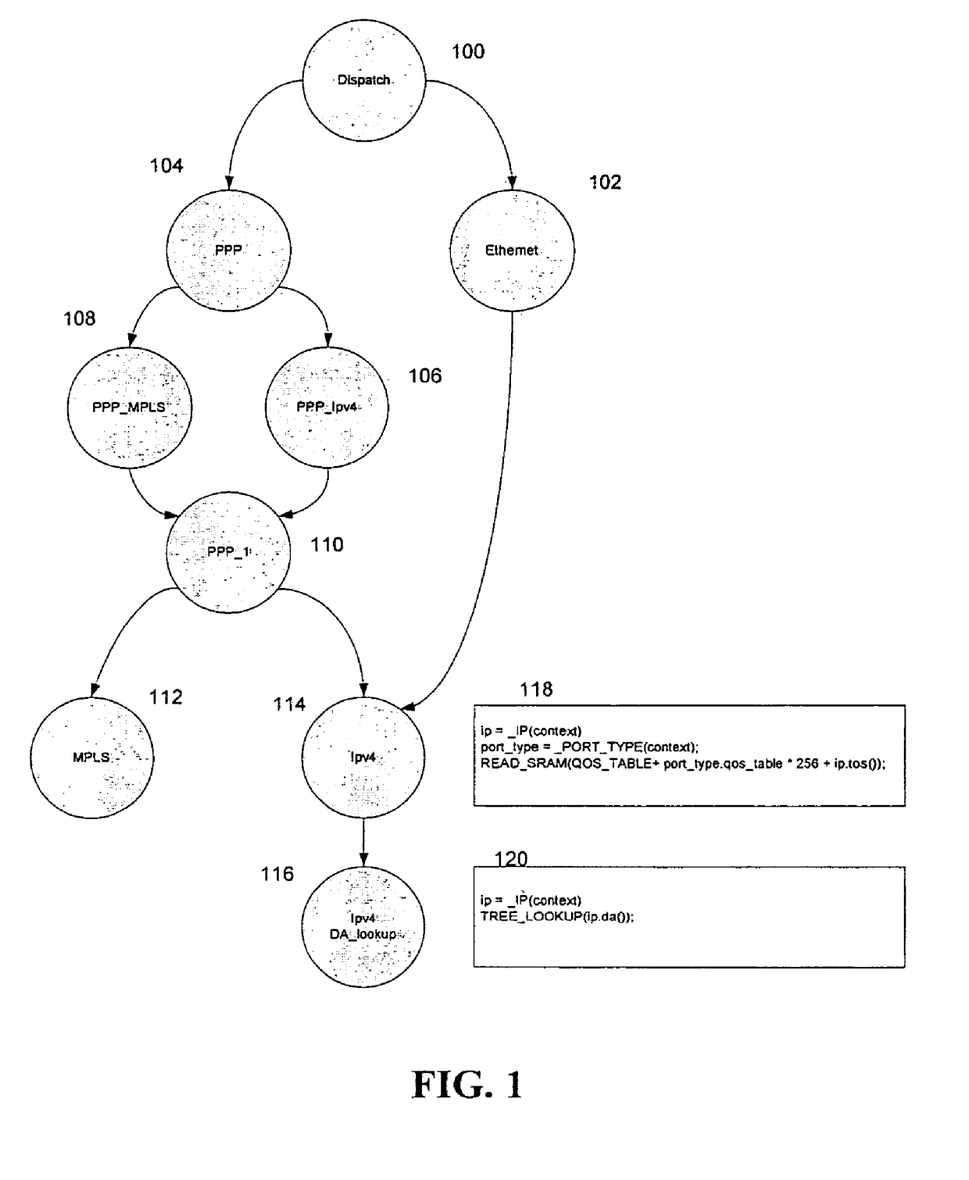
FIG. 1 is a fragment of a simplified microcode program that might be implemented using the present invention.

A fragment of a simplified microcode program is shown in FIG. 1 as a finite state machine. (Specifying network processor microcode as a finite state machine is not new. Teja sells a product that enables programming traditional network processors using finite state machines. In fact, flow charts are a traditional way to represent arbitrary programs as finite state machines.) This microcode is given for illustration purposes and is thus far from complete. As each packet is received, it is processed by the state machine. In this sample microcode, when a packet is arrived, it is dispatched at 100 to either a PPP handler 104 or an Ethernet handler 102. The PPP handler does a second dispatch to either PPP-specific IPv4 106 or MPLS handlers 108. Both of these then transition to another PPP state 110 that then dispatches to the Layer-2 independent IPv4 114 or MPLS 112 handlers. Two states of the IPv4 handler are expanded so that some of the microcode can be seen. In the IPv4 state transition 114, the QoS table is read to determine what sort of QoS this particular interface and the type of the packet will be assigned. The IPv4_DA_lookup state 116 then performs the tree lookup for the destination address of the IP packet.

There are several notable characteristics of this microcode. The first is that each state specifies the next state. There may be more than one next state. To simplify the microcode, assume that it is a standard finite state machine, where at any given instance, a state can only transition to a single next state. Thus, states with more than one possible next state must be able to dynamically specify what the next state will be. Such control is analogous to a branch. The second notable characteristic is that each state can specify both simple computation and functional unit calls. The simple computation is free-form, while the functional unit calls are very similar to calling a library function; one must adhere to a specific calling convention and ensure that all of the arguments are correctly specified.

To dig deeper, below is a microcode example that processes an IPv4 packet. For this example, we assume that the packet is IPv4 and thus there is no initial classification to determine that fact. This microcode is for illustrative purposes only and thus has been heavily simplified and is not complete.

Instruction 1: Parse incoming header (RxPD) and initialize outgoing header (FwPD)

---
Initialize_FwPD_and_register_file(RxPD). Read known fields from the RxPD, send them through the RxPD parse unit that extracts and generates values to fill in specific fields in the FwPD and register file such as the packet length, source module and location of the packet. Many of these fields are simply copied. The other fields are zeroed.
interface_record = Read_interface_record(RxPD.source_LineIn).

---

Instruction 2: Do a CAM lookup on source and destination address, using table pointers found in the interface parameters record. We need to check a few simple things before launching a tree search. These include Martian (or illegal) source addresses, multicast destination addresses, and for-me destination addresses)

---
    dest_ptr = CAM_lookup (RxPD.dest, interface_record.dest).
    src_ptr = CAM_lookup (RxPD.src, interface_record.src).
    regs.qos1 = {interface_record.qos, regs.qos0}

---

Instruction 3: (CAM returns two addresses. Convert into pointers, so we can retrieve the results)

---
call parse_IPv4_command(RxPD.IPv4_header) which does:
  Sets ipModifier register to the "don't fragment bit" in the IPv4 header
  If the header length is less than 20, signal a bad header. If it is 20, there are no options. If it is over 20 and less than 24 there are options. If it is 24 it has a single option, potentially "ICMP echo". Over 24, error.
  Check TTL.
  Other checks to ensure a good header.
regs.total_qos = QoSLookup(RxPD.IPv4_header.TOS, regs.qos1)
flags.mirror = interface_record.mirrored
tree_ptr = tree_lookup(src_ptr, dest_ptr, ......);

---

Note that each of the three instructions contains multiple procedure calls, each corresponding to a functional unit, that potentially describe a significant amount of work and may do more than one task. For example, the CAM_lookup may increment multiple counters in addition to doing a CAM_Lookup. What each function call does is, of course, dependent on the how each function call is defined. Of course, the microcode writer will know what each procedure does.

A procedure call such as the CAM_lookup, will generally have a one-to-one mapping to a functional unit command. It is possible that multiple functional unit commands are bundled into a single procedure call and may be common in cases such as a CAM lookup is performed.

Note also that a particular instruction should not depend on any other computation done in the same instruction but can depend on whatever was done in previous instructions (assuming the destination register(s), if any, has not been overwritten.) Thus, such dependent code should be separated into different instructions.

Note also that it is possible to do two of the same procedure calls in the same instruction. For example, Instruction 2 does two CAM_lookup calls. It may be that the underlying hardware supports two simultaneous CAM_lookup calls or there may be the ability to queue two calls, but only a single functional unit to perform those calls. Of course, it must somehow be ensured that the performance requirements can be met with the available hardware.

Note also that there is additional logic and datapaths that processes data returning from functional units or data going to a functional unit as an argument. For example, the TOS header is extracted from the IPv4 header in Instruction 3 and fields are extracted from the interface_record to be used as arguments for function calls. Additional logic and datapaths are constructed for those purposes and are selected and controlled either directly or indirectly by fields in the generated code that runs on the network processor.

Once the microcode is defined, a network processor is generated to run specifically that microcode. When the microcode is changed, the processor is also probably changed. In fact, in many cases microcode will not even run on a processor generated for another microcode.

Our preferred embodiment uses a compiler to automatically generate the network processor from the microcode. The compilation problem is easier if the target architecture is constrained to match the microcode and vice-versa. Thus, the preferred embodiment of the network processor is a configurable, multithreaded state machine that is customized to run the given microcode. The microcode is written assuming the functional units that will be provided in the network processor. Each microcode state is a single wide instruction that specifies what functional units are called, with what arguments generated from the packet being processed and any previously computed state. Thus, each microcode instruction can use each functional unit no more than once. To simplify microcode, the machine ensures that all functional unit calls made in prior instructions are fully complete before executing the next instruction. Such implicit synchronization, though potentially more conservative than is necessary, dramatically simplifies the microcoding task and reduces the required instruction rate since no microcode effort is necessary to determine if data is available. This scheme also automatically deals with wide variations in the service time of different functions, or even the same function with different inputs.

The preferred embodiment is a multithreaded Very-Long-Instruction Word (VLIW) ISA and processor tuned for the microcode. The microcode assumes that each VLIW instruction completes in-order, making programming simple. Multithreading enables high performance even under the in-order instruction execution assumption. Making the network processor VLIW provides high performance since multiple functional units can be specified in each instruction, but also allows it to run at very low clock rates, making it easier to implement. The compiler reduces the network processor design time tremendously by allowing microcode software engineers to generate high-performance network processors as easily as writing microcode for a traditional programmable network processor. Such an approach could lead to next-generation network processor architectures that have much higher performance while being easier to implement and program. It can also be combined with a traditional RISC-core network processor architecture, where part of the code runs on our novel network processor and part runs on the traditional network processor to allow for even more flexibility and/or backward compatibility.

Note that the VLIW instruction can be automatically generated by the compiler from the microcode by finding the union of the needed resources across all instructions and combining common resources used in different instructions.

Also, a particular functional unit could be used more than once per instruction if its overall bandwidth is sufficient to maintain the desired performance.

Thus, the microcode is compiled to generate the network processor that will be used to execute the microcode. In addition, the microcode is compiled to generate the executable code, which we also call compiled-microcode or nanocode. In the preferred embodiment, the nanocode is the entire set of control signals that control the network processor. Of course, the actual network processor implementation may require another instruction representation.

Figure 2:
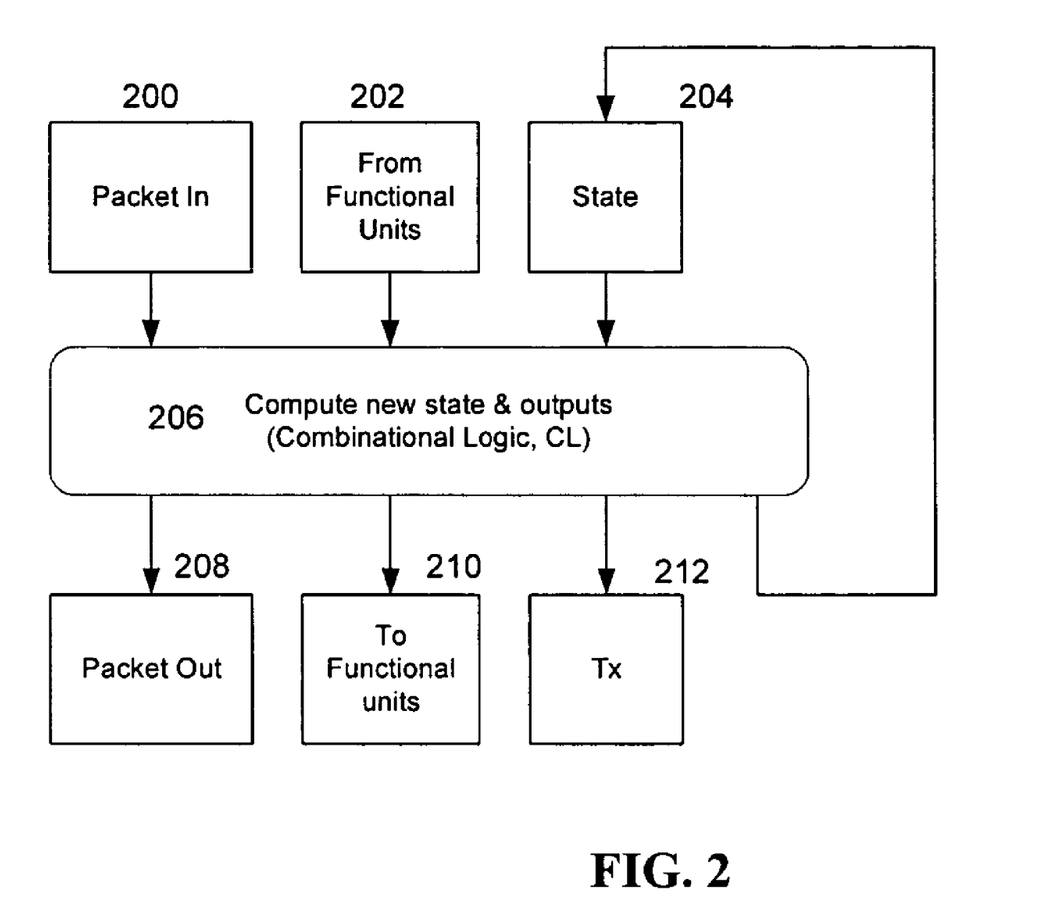
FIG. 2 is a block diagram of a simplified version of hardware implemented with the present invention.

There are well known ways to implement finite state machines. A simplified version of the hardware to execute the nanocode (which we will call a micro-engine) is shown in FIG. 2. When a packet is first received, it is written into the Packet In buffer 200 and its State is initialized. The Combinational Logic 206 uses those inputs to rewrite the packet into Packet Out 208, issue functional unit calls 210 and writes forwarding information for the router into Tx 212. The Combinational Logic 206 cannot finish all tasks in a single cycle since it must also rely on results 202 of its functional unit calls. Thus, the rounded rectangle is combinational logic and the standard rectangles are memories.

This design is a modified one-stage pipeline, where the initial state which is the packet, the port the packet arrived on, etc., is passed through combinational logic and then the appropriate functional units that generate results that are written back to state 204 associated with that packet. The functional units may take much longer than one cycle, making this machine more than a simple one-stage pipeline. This micro-engine iterates through the nanocode until the packet has been fully processed and the final packet (packets can be rewritten by the network processor) is ready to be forwarded.

The functional units are generally pipelined and can have very long and variable latencies. Take a counter for example. Because the number of counters tends to be larger than what can fit on a single chip, counters are generally stored in memory. In that case, the latency to increment a counter is approximately equal to the latency to memory. In order to save power and make back-to-back increments to the same counter more convenient, however, it may be that the functional unit implementing the counter incrementer functional unit caches a few of the counter values. Thus, if there are back-to-back accesses to the same counter, the accesses after the first access will be satisfied from the cached copy. In this case, the latency to increment a counter can vary substantially. There are many other examples of long variations in latency. Long latencies can be dealt with by having a long pipeline that mimics the latency in the control path.

Thus, for performance reasons, it is not advisable to a specific instruction to wait until all of its functional unit calls are complete before doing any additional work. Our preferred embodiment, however, ensures that the previous instruction is fully complete before executing the next instruction. Thus, due to the preferred embodiment requirement that the previous instruction is fully complete before continuing and the fact that the functional units will generally take longer than one cycle, it is generally impossible to issue the next instruction for the same packet immediately after the current one is issued.

Rather than force state machine conditional branches to depend only on data that is available in the state at the beginning of the cycle, the preferred embodiment adds an extra pipeline stage that accepts the results of the functional unit calls and then provides additional combinational logic to perform the branch. This extra pipeline stage makes the processor more efficient. After this addition, the machine looks like FIG. 3.

Figure 3:
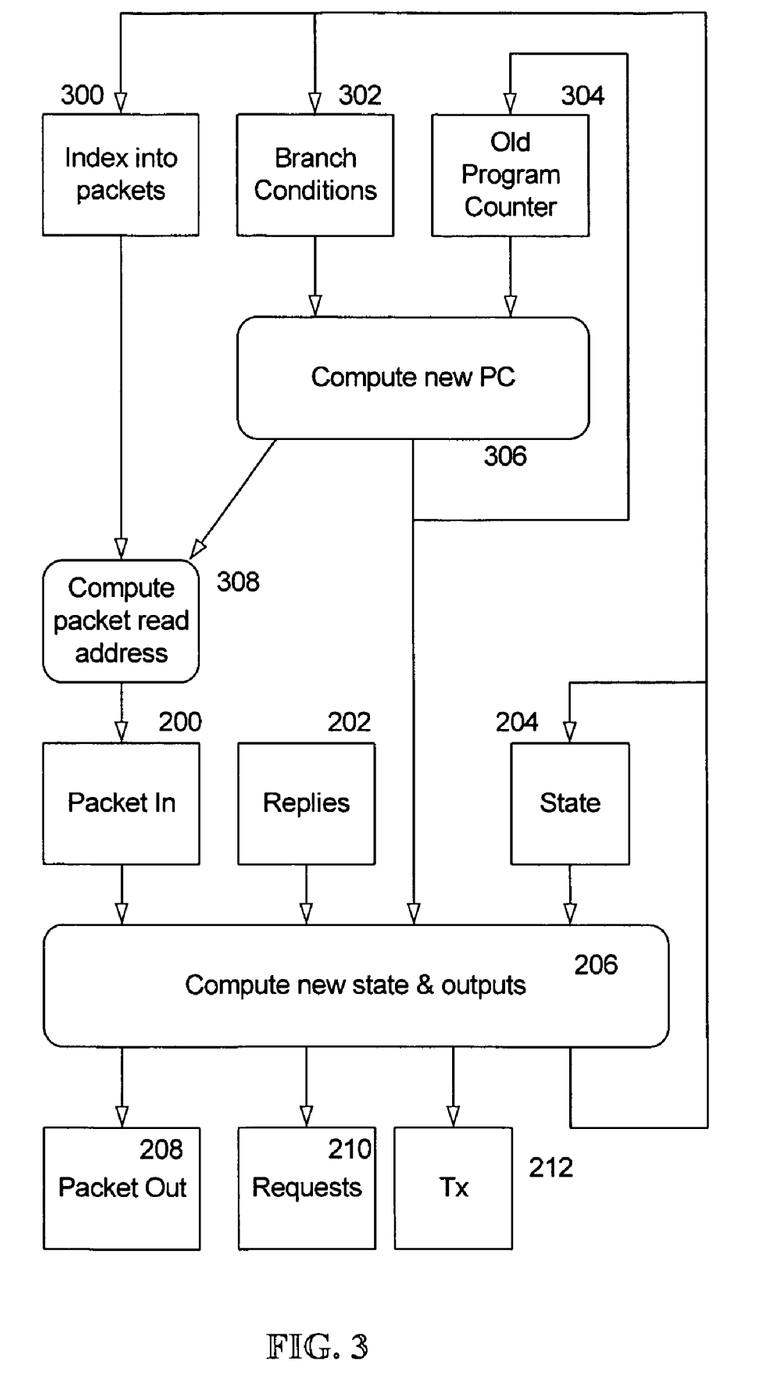
FIG. 3 is a block diagram similar to FIG. 2 but with expanded capabilities.

In addition to the components provided in FIG. 2, the system includes memory to store branch conditions 302 and a program counter 304 as well as logic 306 to compute a new program counter. An index into packets is stored at 300 and a packet read address is computed at 308.

To maximize efficiency, the micro-engine executes an instruction every cycle if there is a ready instruction available. Rather than wait for the current instruction to fully complete before issuing the next instruction for the same packet, the micro-engine can select a ready instruction from another packet to issue. This class of network processors, like most network processors, has multiple packets being processed simultaneously to increase the amount of available work. Thus, after one instruction is issued, the next instruction issued on the next clock cycle is generally not the instruction for the same packet, but the next instruction for another packet.

Since the machine is multi-threaded, each of the memories shown above must have an entry per possible packet being processed.

Determining whether an instruction has fully completed so that the next instruction in its program can be scheduled is not a trivial task. Since each instruction can issue multiple functional unit calls, a simple method would be for each packet being processed to have a counter that is set to the number of functional unit calls when the functional units are first called, and decremented whenever a functional unit completes a call for that instruction. Since there is only one instruction in flight per packet, only one counter is needed. The bandwidth for that counter, however, can be prohibitively high. It needs to be set once per instruction and decremented N times, where N is the number of functional unit calls for this instruction, effectively N+1 the clock rate of the part.

There are many ways that the functional unit calls can be synchronized. One method uses a synchronization tree. Each node in the tree n completion notices from functional units. When a node has accepted its n completion notices, it then sends its completion notice to its parent node. Once the topmost node, the root node, has received completion notices from all of its children nodes, the instruction has completed. Such a scheme only requires each node to accept n completion notices, much less than the total possible number of functional unit completions that can occur in one instruction.

Figure 4:
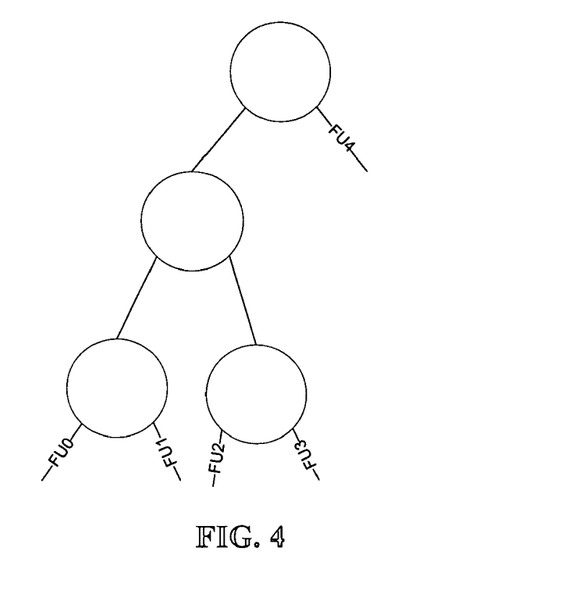
FIG. 4 shows a synchronization tree that might be utilized with the present invention.

FIG. 4 shows a synchronization tree for five functional units labeled FU0-FU4. In this case, n equals 2. n does not have to be a constant, but in this example it is. Notice also that the tree does not need to be balanced.

Another synchronization method, that takes advantage of the fact that most such systems will have in-order functional units, is to periodically schedule an instruction that issues nop requests to all functional units. When all of the nop op requests return, we know that all of the instructions that were enqueued before have completed due to the in-order property of the functional unit processing. A variant marks periodic instructions functional unit calls and issues marked nops to the functional units that the instruction does not call and then watches for all of the marked instructions to return. Since there are far fewer functional unit calls that are being counted, counting those returns is tractable.

Rather than using a synchronization scheme, dead reckoning can also be used. For example, if the maximum functional unit latency is determinable and the number of requests in-line before the new request to the functional unit is known the next instruction can be issued after that maximum latency has elapsed. No synchronization mechanism is needed in that case.

The compiler could produce more than the combinational logic and the nanocode to execute on the micro-engines. The compiler could also generate the underlying micro-engine architecture as well by examining the microcode and determining which functional units are needed by that microcode and what functional units will fit in the given FPGA and the resources, such as memories, attached to the FPGA. The FPGA and associated hardware would be parameters passed to the compiler. The microcode contains calls to pre-defined functions that map to hardware modules implementing those functions. The compiler does standard dataflow analysis to determine which operations can be performed in parallel and then attempts to define a set of functional units that concurrently fit into the FPGA and meet the power budget. This last step may require some human assistance. Once a processor has been defined, the compiler maps the compiled microcode onto the processor.

Thus, this compiler will actually generate the design of the processor hardware and the executable code that will run on processor hardware. The defined processor will include executable code, pre-defined functional blocks as well as special-purpose custom logic and datapaths that perform the appropriate functionality to implement the functionality specified by the microcode. For example, special-purpose logic could include bit-transforms, bit-extracts, etc. that are required to transform/extract data so that it can be processed by the pre-defined functional blocks.

The derived processor can have virtually any underlying architecture such as a simple single-stage processor, a single-instruction pipelined processor, a very-long-instruction-word (VLIW) processor, a dataflow processor or an out-of-order superscalar processor. The architecture actually used is dependent on the ability of the compiler and the constraints. Of course, the compiler, or a companion compiler, would need to produce the nanocode as well.

The design and fabrication method described above is presented in the flow diagram of FIG. 5. The functional units that are available to be implemented in hardware and are thus available to the programmer are defined at 502. Using those functional units, the programmer then writes code at 504 that is restricted to the available functional units and a restricted set of operators that can be implemented with combinational logic and datapaths. A processor design tool then compiles that code at 506 to design the processor hardware, including combinational logic, data paths and functional units. The design tool also compiles the code at 508 to executable code for execution on the hardware designed at 506. Finally, the designed hardware is fabricated and combined with the executable code at 510.

Figure 5:
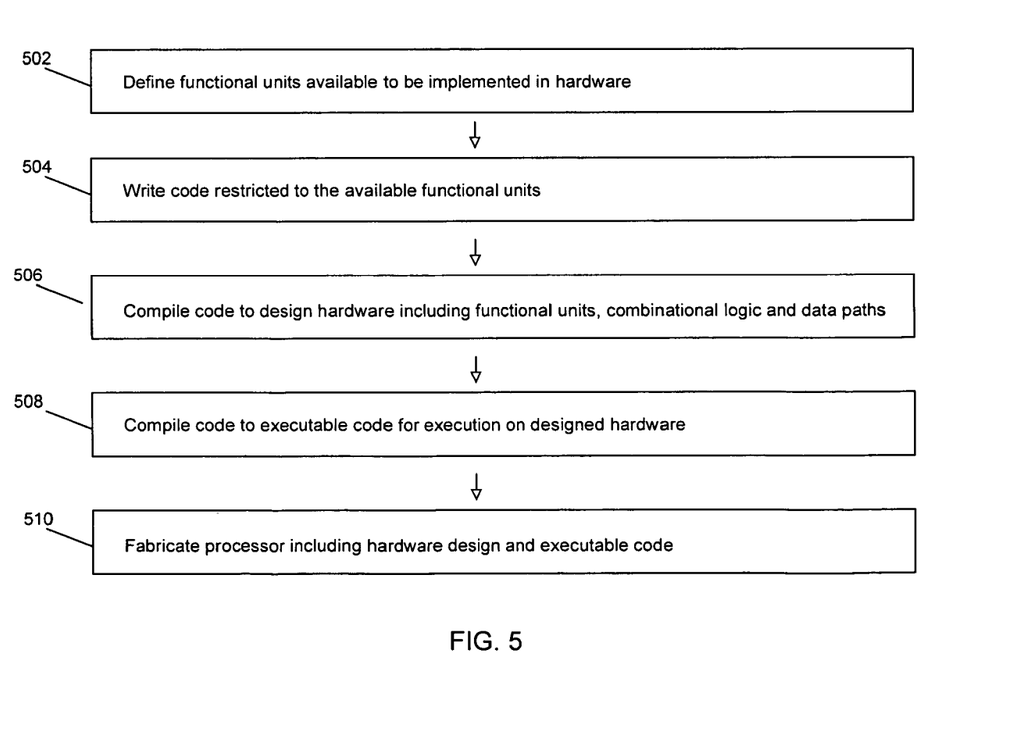
FIG. 5 is a flow chart illustrating an embodiment of the invention.
Figure 6:
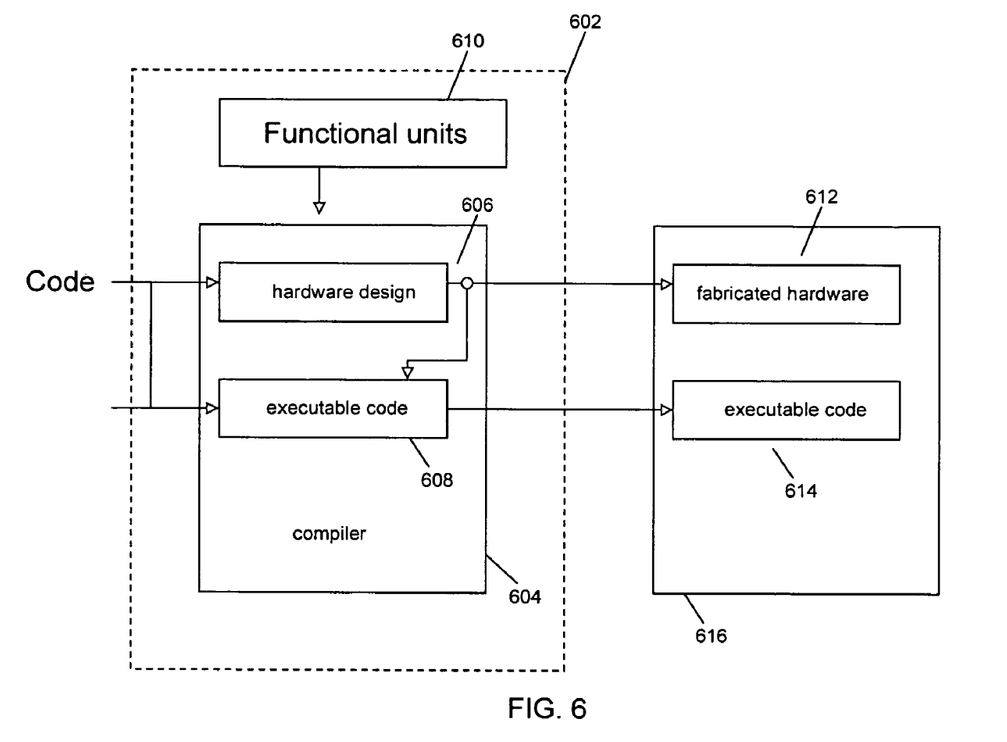
FIG. 6 is a block diagram of a design tool embodying the invention with a fabricated processor.

A design tool that implements the process of FIG. 5 is illustrated in FIG. 6. The design tool 602 includes a compiler 604 having a code-to-hardware-design component 606 and a code-to-executable-code component 608. The design tool also includes a set of predefined functional units 610 available to the programmer. Written code is applied to the hardware design component 606 of the compiler to design hardware that is then fabricated 612. The fabrication process may include using other hardware design tools and compilers obtained elsewhere. The executable code component 608 of the compiler processes the written code to generate executable code 614 to be executed on the hardware 612. Together, the hardware and executable code form the final processor 616.

The invention claimed is:

1. A method of designing a processor comprising:
    writing microcode to be processed by the processor, the microcode including calls to predefined functional units to be implemented in the processor;
    electronically compiling the microcode to design hardware of the processor, the designed hardware including the predefined functional units and a custom data path including special-purpose logic, the special-purpose logic automatically generated and configured to perform specialized tasks corresponding to specific instructions of the microcode by processing data going to the predefined functional units, data going to memory, data returning from the predefined functional units, and data returning from memory; and
    electronically compiling the microcode to generate executable code for execution on the designed hardware.

2. A method as claimed in claim 1, wherein the microcode is restricted by the predefined functional units to be implemented in hardware.

3. A method as claimed in claim 2, wherein the executable code includes very long instruction word code that makes calls to functional units.

4. A method as claimed in claim 3, wherein the microcode is restricted so that each functional unit is used no more than a fixed number of calls from each very long instruction word.

5. A method as claimed in claim 2, wherein the special-purpose logic includes combinational logic to process data input to and/or output from the predefined functional units.

6. A method as claimed in claim 2, wherein a functional unit is implemented in reconfigurable circuitry.

7. A method as claimed in claim 2, wherein a functional unit is implemented in custom circuitry.

8. A method as claimed in claim 1, wherein the designed hardware includes combinational logic in reconfigurable circuitry.

9. A method as claimed in claim 1, wherein the designed hardware includes datapaths in reconfigurable circuitry.

10. A method as claimed in claim 1, wherein at least a portion of the executable code is implemented as a finite state machine in hardware.

11. A method of designing a processor comprising:
    writing microcode to be processed by the processor, the microcode including calls to predefined functional units to be implemented in the processor;
    electronically compiling the microcode to design a custom data path of the processor in hardware, the custom data path including special-purpose logic separate from the predefined functional units, automatically generated, and configured to perform specialized tasks corresponding to specific instructions of the microcode by processing data going to the predefined functional units, data going to memory, data returning from the predefined functional units, and data returning from memory; and
    electronically compiling the microcode to design control of the processor.

12. A method as claimed in claim 11, wherein the control includes executable code.

13. A method as claimed in claim 11, wherein the processor is a network processor.

14. A method of designing and fabricating a network processor comprising:
    writing microcode to be processed by the network processor, the microcode including calls to predefined functional units to be implemented in the network processor;
    electronically compiling the microcode to design hardware of the network processor, the designed hardware including the predefined functional units and a custom data path including special-purpose logic, the special-purpose logic automatically generated and configured to perform specialized tasks corresponding to specific instructions of the microcode by processing data going to the predefined functional units, data going to memory, data returning from the predefined functional units, and data returning from memory;

electronically compiling the microcode to generate executable code for execution on the designed hardware; and fabricating the network processor with the designed hardware and executable code.

15. A method as claimed in claim 14, wherein the microcode is restricted by the predefined functional units to be implemented in hardware.

16. A method as claimed in claim 15, wherein the executable code includes very long instruction word code that makes calls to functional units.

17. A method as claimed in claim 14, wherein the designed hardware includes combinational logic in reconfigurable circuitry.

18. A processor design tool comprising:

a code-to-hardware-design compiler component that designs hardware from microcode, the microcode including calls to predefined functional units, and the designed hardware including the predefined functional units and a custom data path including special-purpose logic, the special-purpose logic automatically generated and configured to perform specialized tasks corresponding to specific instructions of the microcode by processing data going to the predefined functional units, data going to memory, data returning from the predefined functional units, and data returning from memory; and a code-to-executable-code compiler component that generates executable code from the microcode for execution on the designed hardware.

19. A processor design tool as claimed in claim 18, wherein the microcode is restricted by the predefined functional units to be implemented in hardware.

20. A processor design tool as claimed in claim 19, wherein the executable code includes very long instruction word code that makes calls to functional units.

21. A processor design tool as claimed in claim 18, wherein the designed hardware includes combinational logic in reconfigurable circuitry.

22. A processor design tool as claimed in claim 18, wherein the designed hardware includes datapaths in reconfigurable circuitry.

* * * * *